(12) United States Patent
Lin et al.

(10) Patent No.: US 8,633,507 B2
(45) Date of Patent: Jan. 21, 2014

(54) LED WITH VERSATILE MOUNTING WAYS

(75) Inventors: Hsin-Chiang Lin, Hsinchu (TW);
Pin-Chuan Chen, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 0 days.

(21) Appl. No.: 13/596,024

(22) Filed: Aug. 27, 2012

(65) Prior Publication Data

US 2013/0161681 A1    Jun. 27, 2013

(30) Foreign Application Priority Data

Dec. 24, 2011    (CN) .......................... 2011 1 0438404

(51) Int. Cl.
*H01L 33/00* (2010.01)
*H01L 23/48* (2006.01)
*H01L 21/00* (2006.01)

(52) U.S. Cl.
USPC ............ 257/99; 257/100; 257/692; 257/693; 257/735; 257/E23.014; 438/26; 438/116

(58) Field of Classification Search
None
See application file for complete search history.

(56) References Cited

U.S. PATENT DOCUMENTS

| | | | |
|---|---|---|---|
| 8,319,245 B2 * | 11/2012 | Huang et al. | 257/99 |
| 2005/0127507 A1 * | 6/2005 | Ueda et al. | 257/735 |
| 2008/0012125 A1 * | 1/2008 | Son | 257/724 |
| 2008/0170391 A1 * | 7/2008 | Norfidathul et al. | 362/227 |
| 2009/0321774 A1 * | 12/2009 | Ishi et al. | 257/99 |

FOREIGN PATENT DOCUMENTS

| | | |
|---|---|---|
| JP | 11-87780 A | 3/1999 |
| JP | 2000-40781 A | 2/2000 |
| JP | 2010-21259 A | 1/2010 |

\* cited by examiner

*Primary Examiner* — Julio J Maldonado
*Assistant Examiner* — Harpreet Singh
(74) *Attorney, Agent, or Firm* — Altis Law Group, Inc.

(57) ABSTRACT

An LED includes a base, a first lead and a second lead mounted to the base, a light emitting chip electrically connected to the first lead and the second lead, and an encapsulant sealing the chip. The first lead and the second lead each include a first beam and a second beam connected to each other. Each of the first beam and the second beam has two opposite ends protruding beyond two opposite lateral faces of the base, respectively, for electrically connecting with a circuit board.

17 Claims, 10 Drawing Sheets

LED WITH VERSATILE MOUNTING WAYS

BACKGROUND

1. Technical Field

The present disclosure relates to an LED (light-emitting diode), and more particularly, to an LED having leads suitable for versatile mounting ways.

2. Description of Related Art

As a new type of light source, LEDs are widely used in various applications. An LED often includes a base having a cavity defined therein, a pair of leads fixed in the base, a light emitting chip received in the cavity to electrically connect the two leads, and an encapsulant filling the cavity to seal the chip. Generally, the two leads each have an end protruding beyond the base to be exposed to an outside of the base. However, the LED only has the two ends of the two leads exposed outside of the base, causing that the LED is limited to be mounted on a circuit board in a single way, i.e., vertically mounted with a light output direction of the LED being perpendicular to the extending direction of the circuit board or sideways mounted with the light output direction parallel to the circuit board. Furthermore, the LED can be mounted to the circuit board by a single position of the LED.

What is needed, therefore, is an LED with versatile mounting ways which can overcome the limitations described above.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION OF THE EMBODIMENTS

Figure 1:
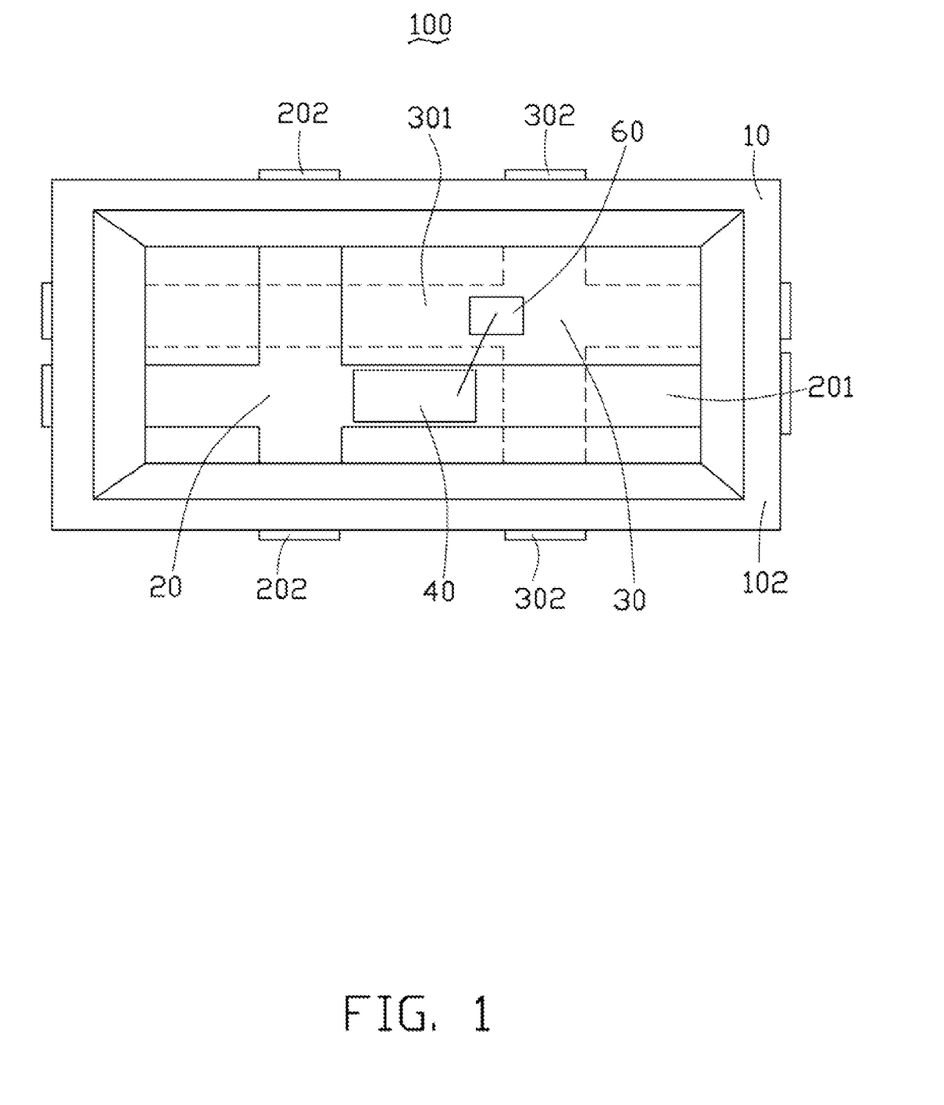
FIG. 1 is a top view of an LED in accordance with a first embodiment of the present disclosure.
Figure 3:
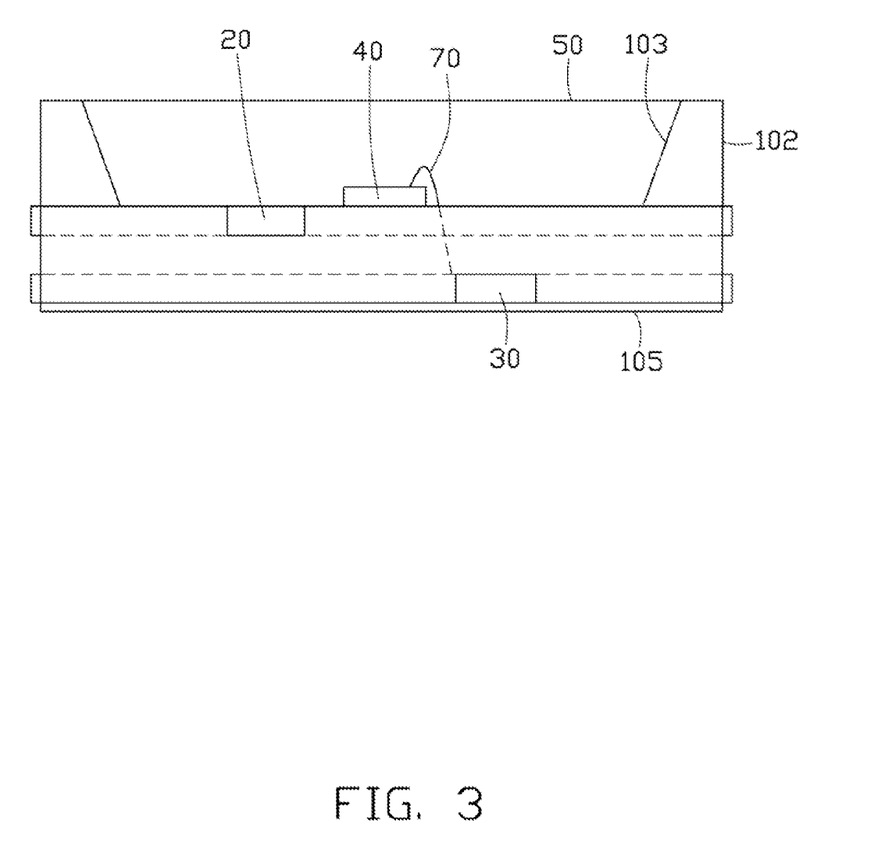
FIG. 3 is a schematic, front view of the LED of FIG. 1.
Figure 4:
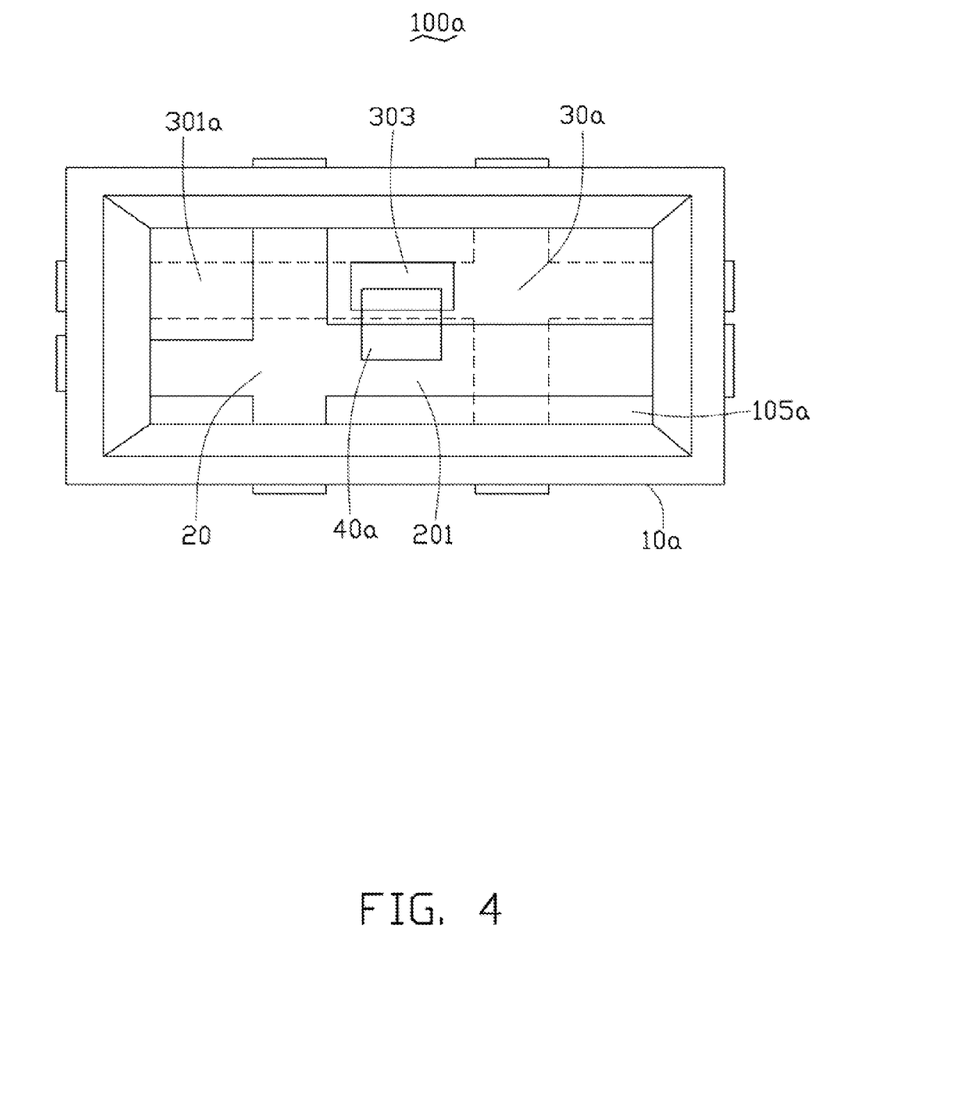
FIG. 4 is a top view of an LED in accordance with a second embodiment of the present disclosure.
Figure 5:
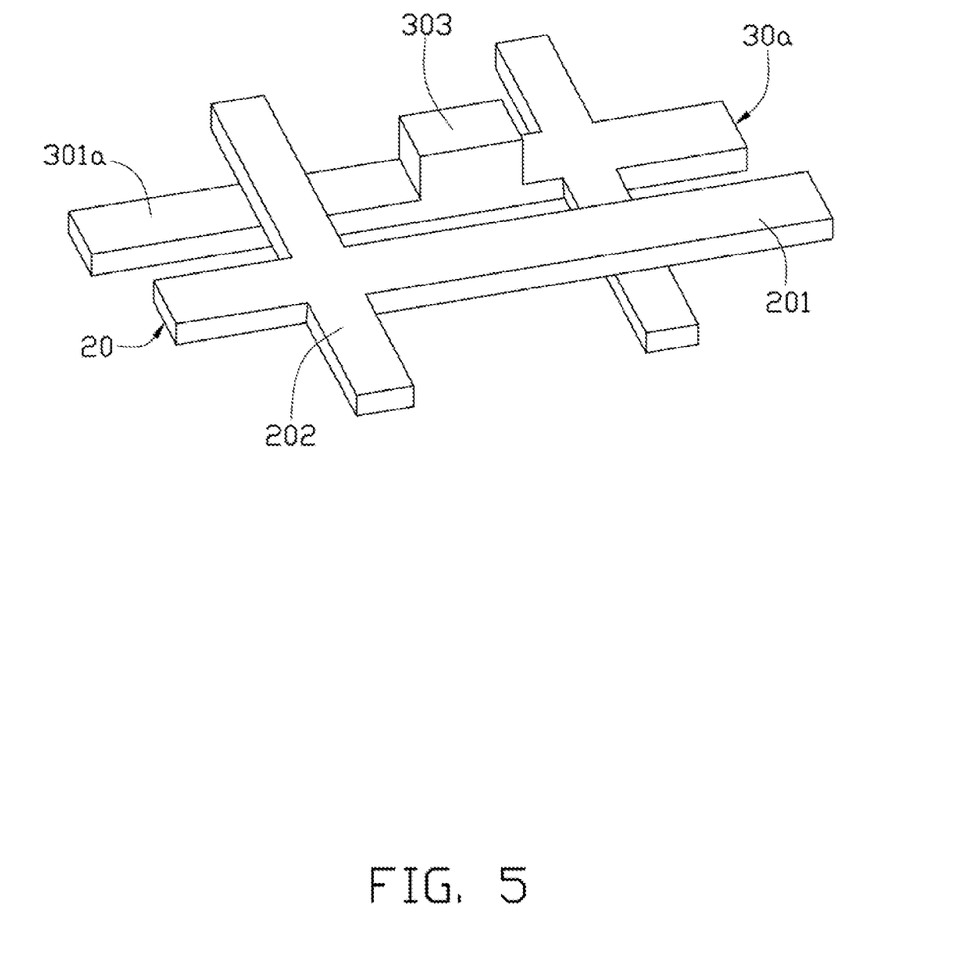
FIG. 5 is an isometric, perspective view of two leads of the LED of FIG. 4.
Figure 6:
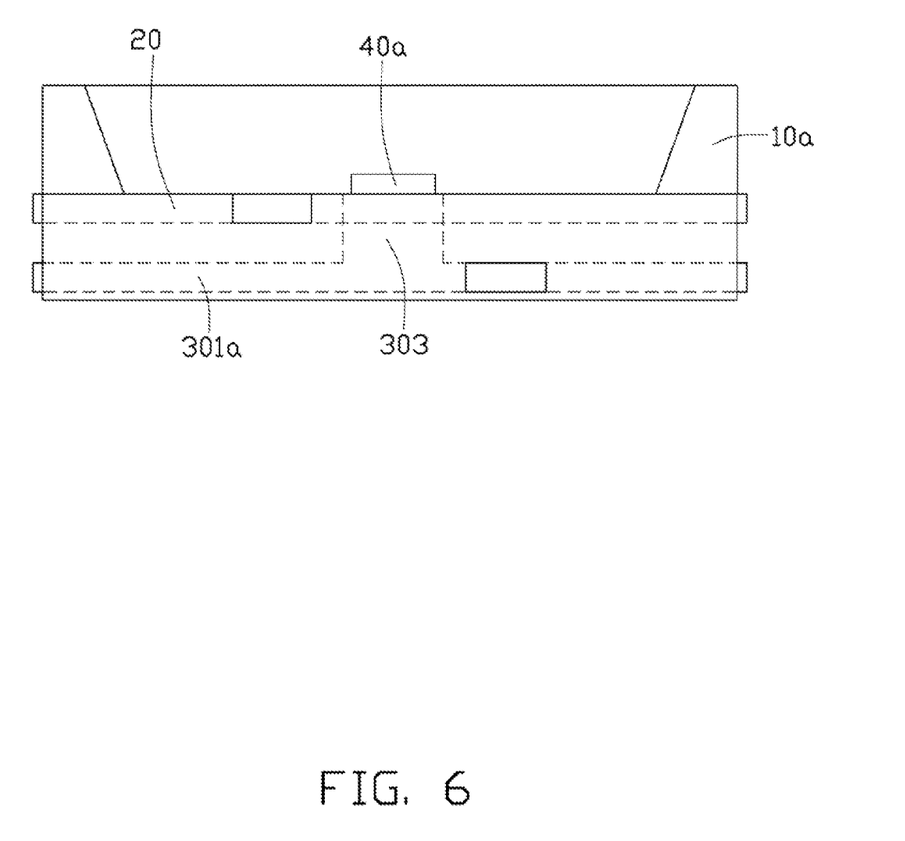
FIG. 6 is a schematic, front view of the LED of FIG. 4
Figure 7:
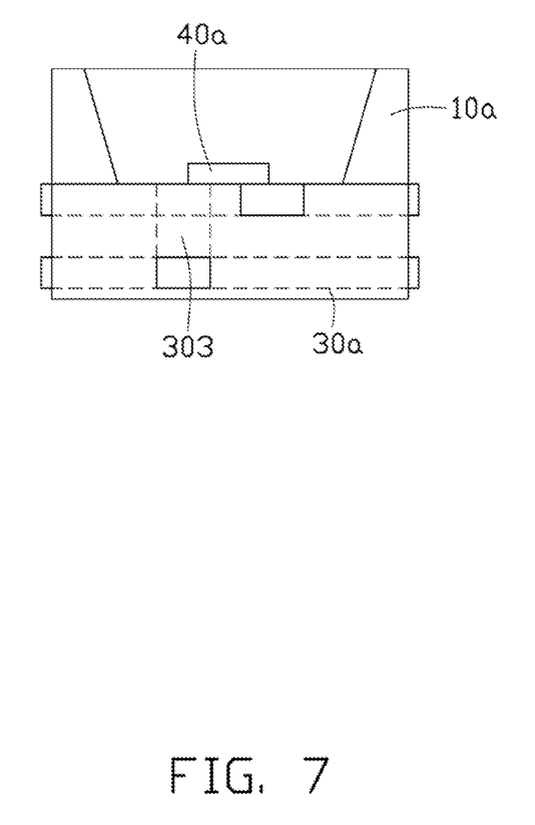
FIG. 7 is a schematic, left view of the LED of FIG. 4.

Referring to FIGS. 1 and 3, an LED 100 in accordance with a first embodiment of the present disclosure is shown. The LED 100 includes a housing 10, two leads 20, 30 mounted in the housing 10, a light emitting chip 40 fixed in the housing 10 and electrically connected to the two leads 20, 30 and an encapsulant 50 sealing the chip 40.

The housing 10 is made of electrically-insulative materials such as plastic, ceramics or the like. The housing 10 includes a base 105 and an annular sidewall 102 extending upwardly from a top face of the base 105. The base 105 has a rectangular shape, and the annular sidewall 102 also has a rectangular shape with a rectangular inner side and a rectangular outer side. The sidewall 102 encloses a cavity 103 above the top face of the base 105. The cavity 103 has a size gradually increasing along a bottom-to-top direction of the housing 10.

Figure 2:
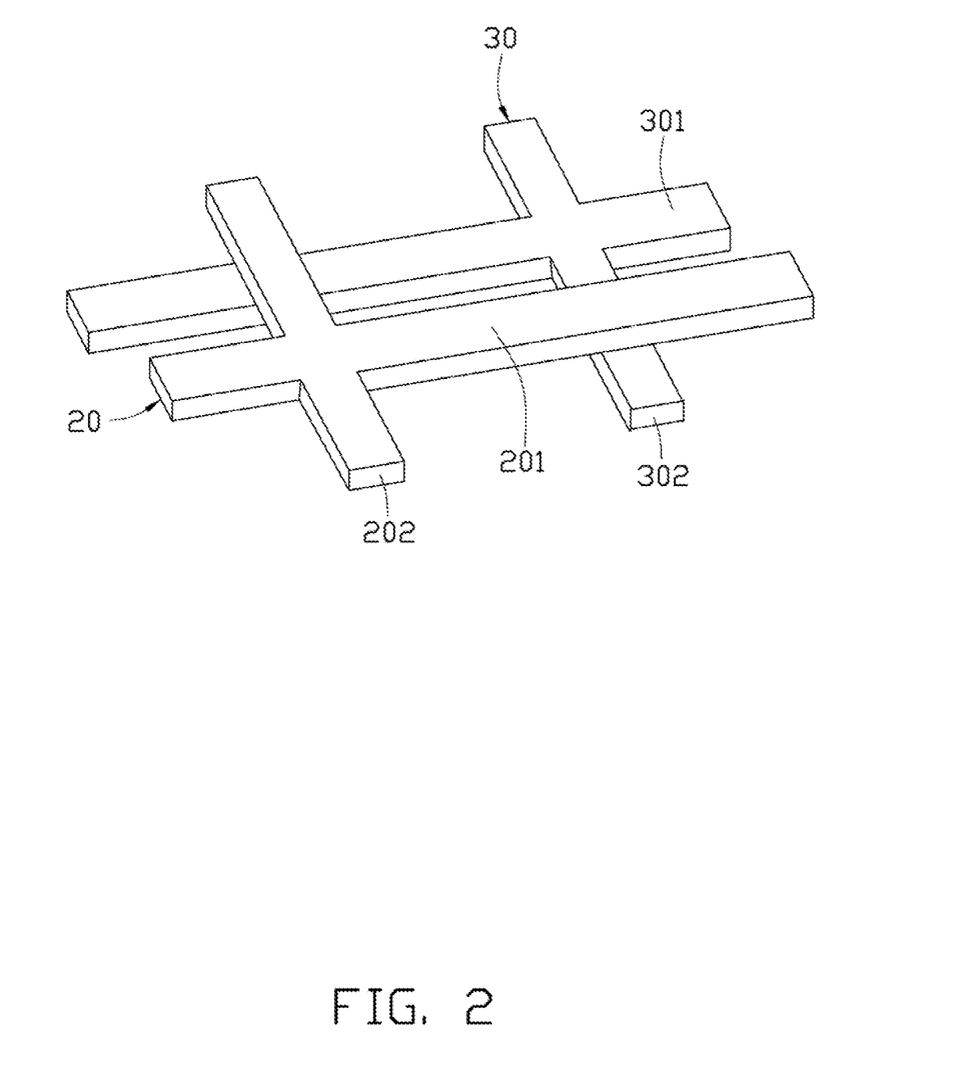
FIG. 2 is an isometric, perspective view of two leads of the LED of FIG. 1.

The two leads 20, 30 include a first lead 20 and a second lead 30 spaced from the first lead 20. Each of the first lead 20 and the second lead 30 includes a first beam 201, 301 and a second beam 202, 302 connected to the first beam 201, 301. The first beam 201, 301 is perpendicular to the second beam 202, 302. The first beam 201, 301 is longer than the second beam 202, 302. The first beam 201, 301 extends along a left-to-right direction of the base 105, and the second beam 202, 302 extends along a front-to-rear direction of the base 105. The first lead 20 and the second lead 30 are embedded in the base 105 in a manner than the first lead 20 is located adjacent to the top face and a front face of the base 105 and the second lead 30 is located adjacent to a bottom face and a rear face of the base 105. A top face of the first lead 20 is exposed on the top face of the base 105. An opening 60 is defined in the top face of the base 105 to expose a part of a top face of the second lead 30. Each of the first beam 201, 301 and the second beam 202, 302 of each of the first lead 20 and the second lead 30 have two opposite ends protruding outwardly beyond a corresponding lateral face of the base 105, wherein front ends of the two second beams 202, 302 of the first lead 20 and the second lead 30 protrude outside the front face of the base 105, rear ends of the two second beams 202, 302 of the first lead 20 and the second lead 30 protrude outside the rear face of the base 105, left ends of the two first beams 201, 301 of the first lead 20 and the second lead 30 protrude outside a left lateral face of the base 105, and right ends of the two first beams 201, 301 of the first lead 20 and the second lead 30 protrude outside a right lateral face of the base 105.

The chip 40 is fixed on the exposed top face of the first beam 201 of the first lead 20. The chip 40 has a bottom electrode (not shown) electrically bonded to the first beam 201 of the first lead 20. The chip 40 has a top electrode electrically connected to the exposed part of the top face of the first beam 301 of the second lead 30 via a wire 70. Therefore, the chip 40 is electrically connected to both the first lead 20 and the second lead 30.

The encapsulant 50 is filled in the cavity 103 to seal the chip 40 and the wire 70. The encapsulant 50 may be made of transparent or translucent materials such as epoxy, silicone or glass. Phosphors (not shown) may be further doped within the encapsulant 50 to change color of light emitted from the chip 40.

In use, the LED 100 can be mounted in different ways for matching different environments. For example, the front ends of the first beams 201, 301 of the first lead 20 and the second lead 30 can be electrically connected to corresponding terminals of a circuit board (not shown) so that the LED 100 is erected to emit light along a forward direction which is parallel to the extending direction of the circuit board. By this way, the LED 100 has a small height suitable for an environment requiring a low profile. Alternatively, the left ends of the second beams 202, 302 of the first lead 20 and the second lead 30 can be electrically connected to corresponding terminals of another circuit board (not shown) so that the LED 100 is erected to emit light along a left direction. By this way, the LED 100 has a small width suitable for a narrow environment. Furthermore, the LED 100 can be connected to terminals of a device (not shown) at different levels by the outside ends of the leads at different faces of the base 105. For example, the front end of the second beam 202 of the first lead 20 may be connected to a lower terminal, and the right end of the first beam 301 of the second lead 30 may be connected to a higher terminal.

FIGS. 4-7 show an LED 100a in accordance with a second embodiment of the present disclosure. Different from the LED 100 of the first embodiment, the first beam 301a of the second lead 30a of the LED 100a of the present embodiment has an upper protrusion 303 protruding upwardly from a top face thereof. The upper protrusion 303 of the second lead 30a extends through the base 105a to reach the top face of the base 105a. A top face of the upper protrusion 303 is coplanar with and exposed through the top face of the base 105a so that the wire 70 of the first embodiment may be omitted by directly bonding two electrodes of the chip 40a to the top face of the upper protrusion 303 and the first beam 201 of the first lead 20. The upper protrusion 303 can facilitate electrical connection of the chip 40a to the first and second leads 20, 30a.

Figure 8:
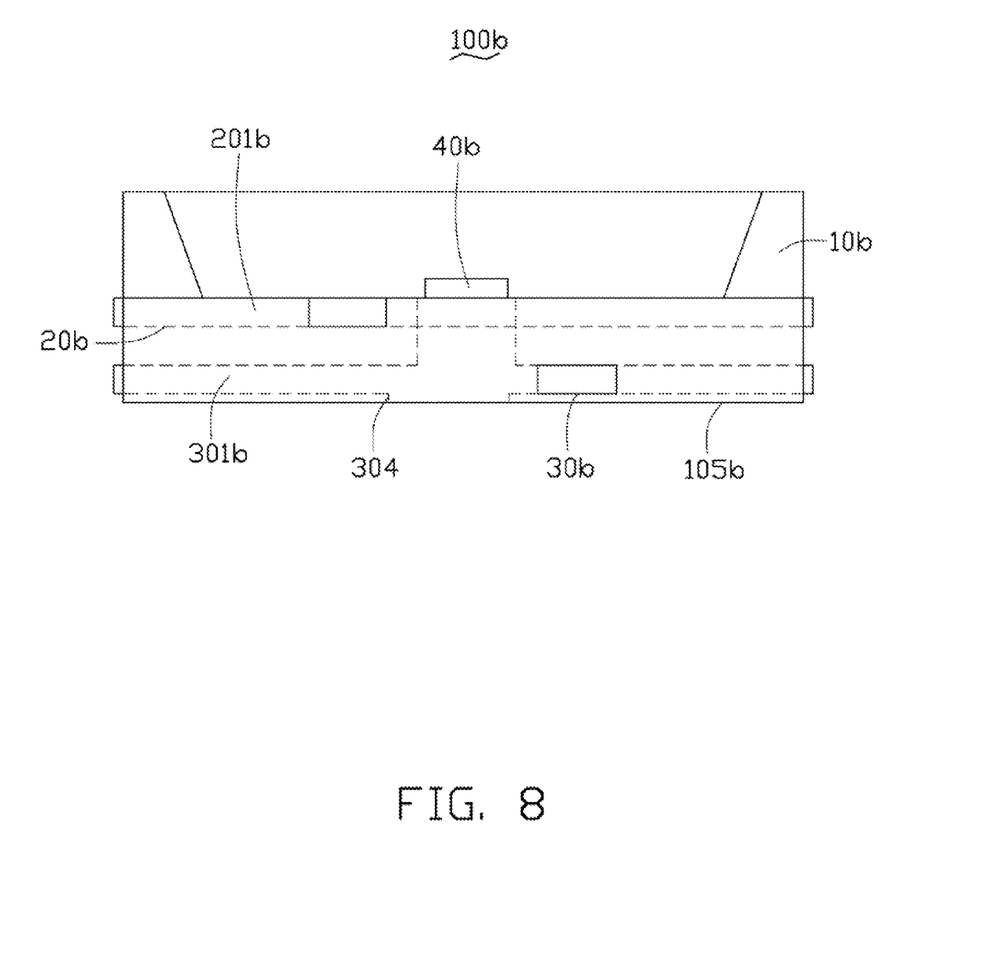
FIG. 8 is a schematic, front view of an LED in accordance with a third embodiment of the present disclosure.
Figure 9:
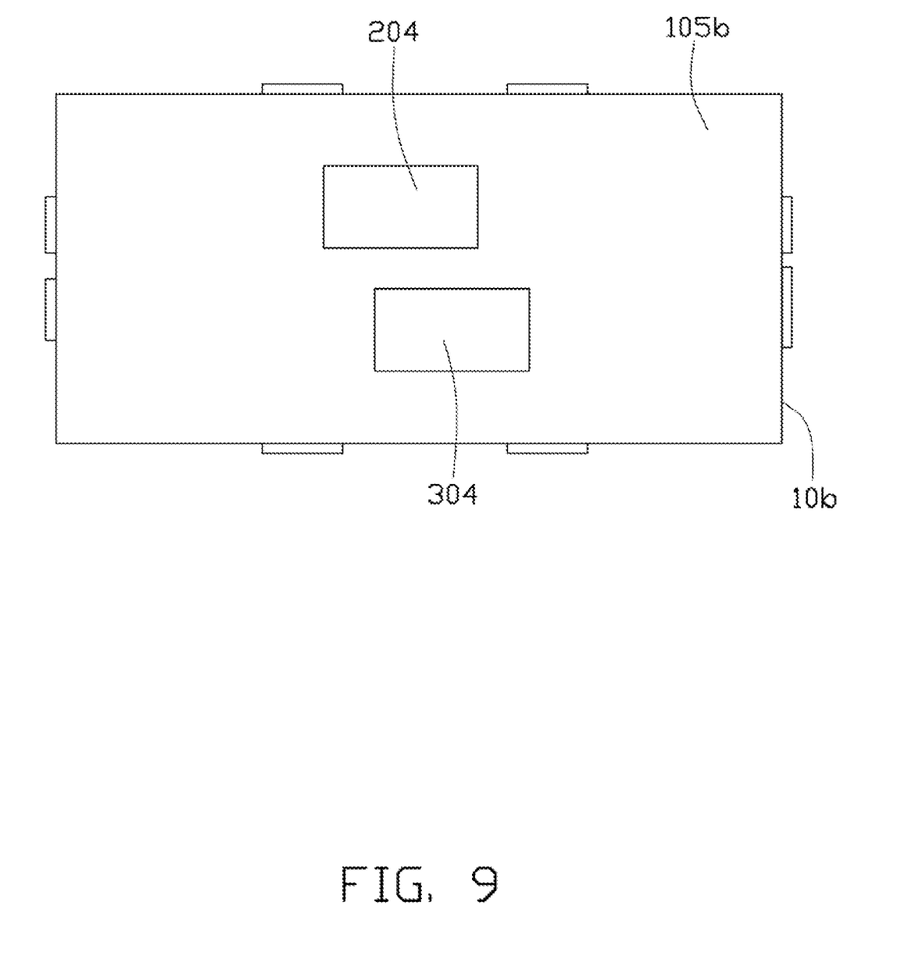
FIG. 9 is a bottom view of the LED of FIG. 8.
Figure 10:
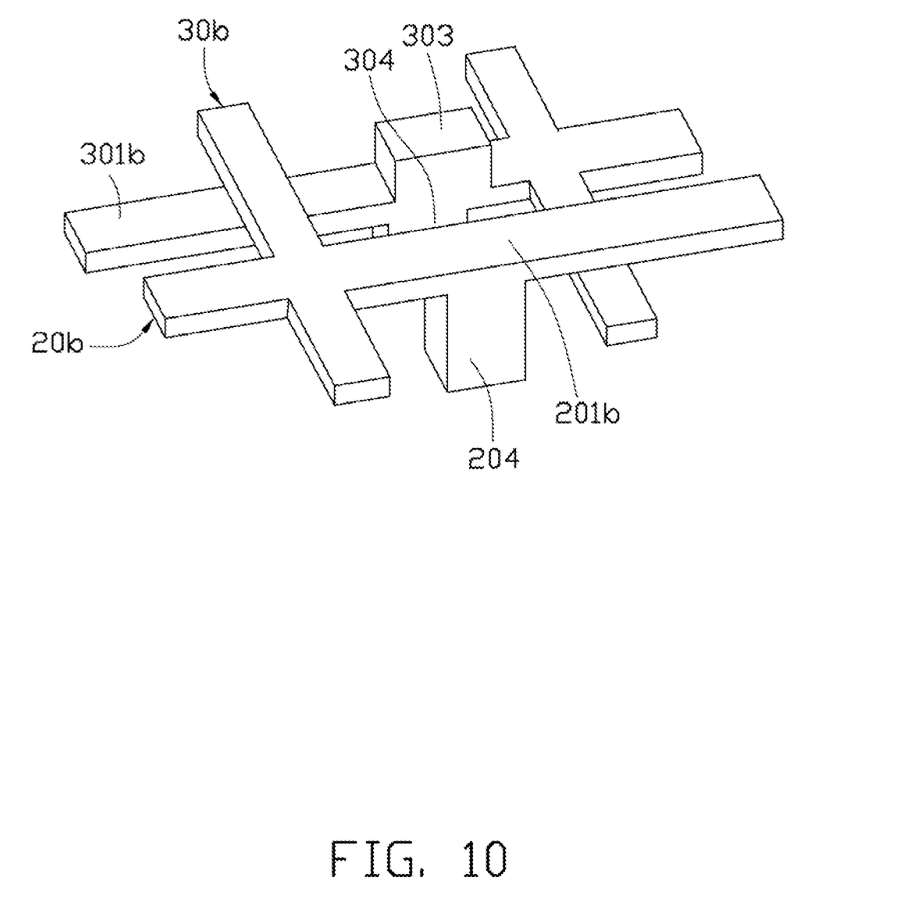
FIG. 10 is an isometric, perspective view of two leads of the LED of FIG. 8.

FIGS. 8-10 show an LED 100b in accordance with a third embodiment of the present disclosure. The LED 100b of the present embodiment further has two lower protrusions 204, 304 added to the first lead 20b and the second lead 20b, in comparison with the LED 100a of the second embodiment. The two lower protrusions 204, 304 protrude downwardly from bottom faces of the first beams 201b, 301b of the first lead 20b and the second lead 30b. A bottom face of each lower protrusion 204, 304 is exposed through the bottom face of the base 105b. The lower protrusion 304 of the second lead 30b is not aligned with the upper protrusion 303 of the second lead 30b. The two lower protrusions 204, 304 exposed at the bottom face of the base 105b provide an additional choice of mounting the LED 100b on a circuit board (not shown) in a vertically mounting manner where the LED 100b emits light along an upward direction which is perpendicular to the extending direction of the circuit board.

It is believed that the present disclosure and its advantages will be understood from the foregoing description, and it will be apparent that various changes may be made thereto without departing from the spirit and scope of the present disclosure or sacrificing all of its material advantages, the examples hereinbefore described merely being preferred or exemplary embodiments.

What is claimed is:

1. An LED (light-emitting diode) comprising:
a base;
a first lead and a second lead mounted to the base;
a light emitting chip electrically connected to the first lead and the second lead; and
an encapsulant sealing the chip;
wherein each of the first lead and the second lead comprises a first beam and a second beam connected to the first beam, the first beam of each of the first lead and the second lead having an end protruding beyond an outer face of the base, and the second beam of each of the first lead and the second lead having an end protruding beyond a different outer face of the base.

2. The LED of claim 1, wherein the outer face and the different outer face of the base are two adjacent outer faces of the base.

3. The LED of claim 2, wherein the two adjacent outer faces of the base are two side faces of the base.

4. The LED of claim 3, wherein each of the first beam and the second beam of the first lead and the second lead comprises two opposite ends protruding beyond two opposite lateral faces of the base, respectively.

5. The LED of claim 1, wherein the first beam is perpendicular to the second beam.

6. The LED of claim 1, wherein the first beam is longer than the second beam.

7. The LED of claim 1, wherein the first lead is located above the second lead.

8. The LED of claim 7, wherein the base defines an opening in a top face thereof, a part of the second lead being received in the base and exposed through the opening.

9. The LED of claim 8, wherein the chip is electrically connected to the exposed part of the second lead by a wire.

10. The LED of claim 7, wherein the second lead comprises an upper protrusion protruding upwardly from the first beam thereof, the upper protrusion being exposed through a top face of the base.

11. The LED of claim 10, wherein the chip is directly connected to the upper protrusion.

12. The LED of claim 1, wherein each of the first lead and the second lead comprises a lower protrusion protruding downwardly from the first beam thereof, the lower protrusion being exposed through a bottom face of the base.

13. An LED (light-emitting diode) comprising:
a base;
a first lead and a second lead connected to the base;
a light emitting chip electrically connected to the first lead and the second lead; and
an encapsulant sealing the chip;
wherein each of the first lead and the second lead comprises an end protruding outside the base along a first direction and another end protruding outside the base along a second direction, the first direction being different from the second direction, the end being configured for electrically connecting with a circuit board.

14. The LED of claim 13, wherein the first direction is perpendicular to the second direction.

15. The LED of claim 14, wherein the first direction and the second direction both are horizontal directions.

16. The LED of claim 14, wherein the first direction is a horizontal direction, and the second direction is a vertical direction.

17. The LED of claim 13, wherein each of the first lead and the second lead comprises other two ends protruding outside the base along a third direction and a fourth direction, respectively, the third direction and the fourth direction being horizontal directions.

* * * * *